(12) United States Patent
Brunner et al.

(10) Patent No.: US 8,476,655 B2
(45) Date of Patent: Jul. 2, 2013

(54) ELECTROMAGNETIC-RADIATION-EMITTING OPTOELECTRONIC COMPONENT AND METHOD FOR PRODUCING AN OPTOELECTRONIC COMPONENT

(75) Inventors: Herbert Brunner, Sinzing (DE); Kirstin Petersen, Freiburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 232 days.

(21) Appl. No.: 11/992,976

(22) PCT Filed: Sep. 22, 2006

(86) PCT No.: PCT/DE2006/001686
§ 371 (c)(1),
(2), (4) Date: May 19, 2009

(87) PCT Pub. No.: WO2007/036206
PCT Pub. Date: Apr. 5, 2007

(65) Prior Publication Data
US 2009/0261365 A1     Oct. 22, 2009

(30) Foreign Application Priority Data

Sep. 30, 2005  (DE) .......................... 10 2005 047 062
Jan. 31, 2006  (DE) .......................... 10 2006 004 397

(51) Int. Cl.
*H01L 33/00* (2010.01)
(52) U.S. Cl.
USPC 257/98; 428/690; 257/E33.074; 257/E33.073; 257/E33.072
(58) Field of Classification Search
USPC .......................................... 428/690; 257/98
See application file for complete search history.

(56) References Cited

U.S. PATENT DOCUMENTS

| | | | |
|---|---|---|---|
| 5,040,868 | A | 8/1991 | Waitl et al. |
| 5,137,844 | A | 8/1992 | Chiulli |

(Continued)

FOREIGN PATENT DOCUMENTS

| | | |
|---|---|---|
| DE | 100 36 940 A1 | 2/2002 |
| DE | 101 47 040 | 4/2003 |

(Continued)

OTHER PUBLICATIONS

Ahmed, S. A. et al. "Effect of multiple light scattering and self-absorption on the fluorescence and excitation spectra of dyes in random media", Applied Optics, vol. 33, No. 13, 1994, pp. 2746-2750.

(Continued)

*Primary Examiner* — Kenneth Parker
*Assistant Examiner* — Dale E Page
(74) *Attorney, Agent, or Firm* — Cozen O'Connor

(57) ABSTRACT

An optoelectronic component comprising a housing and a luminescence diode chip arranged in the housing is specified, which component emits a useful radiation. The housing has a housing material which is transmissive to the useful radiation and which is admixed with radiation-absorbing particles in a targeted manner for setting a predetermined radiant intensity or luminous intensity of the emitted useful radiation. The radiation-absorbing particles reduce the radiant intensity or the luminous intensity by a defined value in a targeted manner in order thus to set a predetermined radiant intensity or luminous intensity for the component. A method for producing an optoelectronic component of this type is additionally disclosed.

18 Claims, 6 Drawing Sheets

U.S. PATENT DOCUMENTS

| | | | |
|---|---|---|---|
| 5,684,309 A | 11/1997 | McIntosh et al. | |
| 5,831,277 A | 11/1998 | Raseghi | |
| 6,172,382 B1 | 1/2001 | Nagahama et al. | |
| 6,613,247 B1 | 9/2003 | Hoehn et al. | |
| 6,616,862 B2 | 9/2003 | Srivastava et al. | |
| 6,623,662 B2 | 9/2003 | Wang et al. | |
| 6,670,748 B2 | 12/2003 | Ellens et al. | |
| 6,849,881 B1 | 2/2005 | Harle | |
| 7,064,480 B2 | 6/2006 | Bokor et al. | |
| 7,263,294 B2 | 8/2007 | Horio | |
| 7,501,660 B2 | 3/2009 | Schmid et al. | |
| 8,026,526 B2 | 9/2011 | Weber-Rabsilber et al. | |
| 2002/0132454 A1* | 9/2002 | Ohtsu et al. | 438/486 |
| 2002/0192477 A1 | 12/2002 | Honda et al. | |
| 2003/0168720 A1 | 9/2003 | Kamada | |
| 2004/0061433 A1 | 4/2004 | Izuno et al. | |
| 2004/0062699 A1 | 4/2004 | Oshio | |
| 2004/0094757 A1 | 5/2004 | Braune et al. | |
| 2005/0006794 A1 | 1/2005 | Kashiwagi et al. | |
| 2005/0129957 A1 | 6/2005 | Kashiwagi et al. | |
| 2005/0282975 A1* | 12/2005 | Haitko et al. | 525/476 |
| 2006/0014429 A1 | 1/2006 | Schmid et al. | |
| 2007/0004065 A1 | 1/2007 | Schardt et al. | |
| 2007/0018102 A1 | 1/2007 | Braune et al. | |
| 2007/0259206 A1* | 11/2007 | Oshio | 428/690 |
| 2008/0128718 A1 | 6/2008 | Sumitani | |
| 2009/0261365 A1 | 10/2009 | Brunner et al. | |

FOREIGN PATENT DOCUMENTS

| | | |
|---|---|---|
| DE | 103 61 661 | 3/2005 |
| DE | 10 2005 061 828 | 1/2007 |
| DE | 10 2005 041 064 | 3/2007 |
| DE | 10 2006 004 3 | 4/2007 |
| EP | 1 174 931 A2 | 1/2002 |
| EP | 1 193 772 | 4/2002 |
| EP | 1 408 559 | 4/2004 |
| JP | 63-159859 | 10/1988 |
| JP | 06-091934 | 4/1994 |
| JP | 11-119228 | 4/1999 |
| JP | 2003-015278 | 1/2003 |
| JP | 2003-017755 | 1/2003 |
| JP | 2003-046140 | 2/2003 |
| JP | 2003-335073 | 11/2003 |
| JP | 2005-181750 | 7/2005 |
| JP | 2008-160091 | 7/2008 |
| WO | WO 00/33390 | 6/2000 |
| WO | WO 01/39282 | 3/2001 |
| WO | WO 2005/008789 | 1/2005 |
| WO | WO 2007/036206 | 4/2007 |

OTHER PUBLICATIONS

McNeil, L. E. et al. "Multiple Scattering From Rutile $TiO_2$ Particles", Acta mater, 48, 2000, pp. 4571-4576.

Danker Stefan: "Einsatz der Laserinduzierten Glühtechnik zur Charakterisierung von Nanopartikeln unter produktionsnahen Bedingungen", Dissertation, Erlangen 2004, p. 38.

Pawlyta Mirka: "Mass Fractal Dimension of Soot Aggregates" University of Silesia, Faculty of Earth Sciences (2 pages), Jul. 19, 2004-Jul. 31, 2004.

Technische Information: "Wärmeleitfähigkeit and IR—optische Eigenschaften von Pigmentruβen", Carbon TI 1229, degussa, 2000.

* cited by examiner

ELECTROMAGNETIC-RADIATION-EMITTING OPTOELECTRONIC COMPONENT AND METHOD FOR PRODUCING AN OPTOELECTRONIC COMPONENT

RELATED APPLICATIONS

This is a U.S. national stage of application No. PCT/DE2006/001686, filed on 22 Sep. 2006.

This patent application claims in each case the priority of German patent applications 10 2005 047 062.9 filed Sep. 30, 2005 and 10 2006 004 397.9 filed Jan. 31, 2006, the disclosure content of both of which is hereby incorporated by reference.

FIELD OF THE INVENTION

The present invention relates to an optoelectronic component having a housing and a luminescent diode chip arranged in the housing, and to a method for producing an optoelectronic component of this type.

BACKGROUND OF THE INVENTION

A light-emitting optoelectronic component is disclosed in U.S. Pat. No. 5,040,868, for example. It has a housing basic body, which surrounds by moulding two electrical conductor tracks of a leadframe and also has a recess in which an electromagnetic-radiation-emitting luminescence diode chip is electrically conductively and mechanically mounted. The recess is potted with a radiation-transmissive casting composition, by means of which a coupling-out of electromagnetic radiation from the luminescence diode chip is improved and the luminescence diode chip is protected from external influences.

Luminescence diode chips used in components of this type are subjected to certain manufacturing fluctuations during their production which often lead to fluctuations in the brightness of semiconductor chips of nominally identical type during the operation thereof. Both wafers that are produced in different epitaxy process runs and different wafers that are produced simultaneously in one process run are subjected to such manufacturing fluctuations, which in particular comprise fluctuations in epitaxy processes and doping processes.

It is an object of the present invention to provide an optoelectronic component of the type mentioned in the introduction which can be produced in a technically simple manner with a predetermined radiant intensity or luminous intensity. Moreover, the intention is to specify a method for producing optoelectronic components of this type.

This object is achieved by means of an optoelectronic component or a method in accordance with the independent patent claims. The dependent patent claims relate to advantageous embodiments and preferred developments of the component and of the method.

An optoelectronic component comprising a housing and a luminescence diode chip arranged in the housing is specified, which component emits an electromagnetic useful radiation. The housing has a housing material which is transmissive to the useful radiation. Said housing material is admixed with radiation-absorbing particles in a targeted manner for setting a predetermined radiant intensity or luminous intensity of the emitted useful radiation.

The wavelength spectrum of the useful radiation preferably comprises a range visible to the human eye. Accordingly, the luminous intensity of a useful light emitted by the optoelectronic component is preferably set by the radiation-absorbing particles.

In connection with the present application, the term "radiation-absorbing particles" is not to be understood to mean phosphors which are absorbent for a radiation in a first wavelength range that is emitted by the luminescence diode chip and are excited by this radiation to emit an electromagnetic radiation in a second wavelength range, which is different from the first wavelength range. In other words, the radiation-absorbing particles do not re-emit optical radiation when they have absorbed an electromagnetic useful radiation of the component. It is possible, however, for the radiation-absorbing particles not only to absorb but also in part to scatter the useful radiation.

The radiant intensity or luminous intensity emitted during the operation of the optoelectronic component is reduced in a targeted manner in a technically simple way by the radiation-absorbing particles. A reduction of the efficiency of the optoelectronic component is thus accepted in order to precisely set the radiant intensity or luminous intensity of said component independently of fluctuating radiant intensities or luminous intensities of the luminescence diode chips used.

A method for producing an optoelectronic component is specified, moreover, in which a luminescence diode chip is provided. The radiant intensity or luminous intensity emitted by the luminescence diode chip during the operation thereof is measured. In the case of a composition to be provided which is transmissive to the useful radiation and is also admixed with radiation-absorbing particles, the concentration of the radiation-absorbing particles is selected in a targeted manner depending on the measured radiant intensity or luminous intensity in order thereby to indirectly set a radiant intensity or luminous intensity to be obtained in the component. A further method step involves arranging the composition which is transmissive to the useful radiation in a beam path of the electromagnetic radiation emitted by the luminescence diode chip during the operation thereof.

The composition is expediently a curable composition into which the radiation-absorbing particles are mixed in the uncured state. The setting of a brightness to be obtained, that is to say a radiant intensity or luminous intensity of the component, requires, with the method specified, measuring the radiant intensity or luminous intensity emitted by the luminescence diode chip and also selecting the concentration of the radiation-absorbing particles depending on the measurement result. This can be carried out in a technically simple way and enables the brightness to be set very precisely.

The radiation-absorbing particles are advantageously absorbent for the entire wavelength spectrum of the useful radiation. In addition or as an alternative, they are advantageously absorbent for the entire wavelength spectrum of the radiation emitted by the luminescence diode chip during the operation thereof. Particularly preferably, the absorption coefficient of the radiation-absorbing particles varies by less than 10% in the entire spectrum of the useful radiation. In particular, in the relevant wavelength range the particles have a wavelength dependence of negligible magnitude in terms of the absorption. As a result, the brightness of the component can be reduced without significantly influencing the emission spectrum of the useful radiation.

In accordance with a further advantageous embodiment of the component, the housing material which is transmissive to the useful radiation has at least one phosphor. It has been established that precise setting of the brightness by means of the radiation-absorbing particles is possible in this case, too.

The radiation-absorbing particles particularly preferably have carbon black. Carbon black is generally known as a by-product in combustion processes. Moreover, it is produced industrially and used as a colorant, particularly as a reinforcing filler in automobile tyres. Carbon black generally has a relatively great wavelength dependence in terms of its absorption behaviour, which, in particular, also holds true for visible light. It has been established, however, that specific forms of carbon black have a very low wavelength dependence in terms of the absorption behaviour in the visible wavelength range.

Industrial carbon black is produced with various defined technical properties. Carbon black is present in the form of aggregates composed of a plurality of primary particles. In particular carbon black having particularly small primary particle sizes is suitable for a use as radiation-absorbing particles. Moreover, it is advantageous to use industrial carbon black with a compact aggregate structure. The expression "low structure carbon black" (LSCB) is used by experts for such types of carbon black. The aggregates preferably have an average extent of less than or equal to 1 µm.

In accordance with one expedient embodiment of the component, the radiation-absorbing particles are electrically insulating. It is thus possible for the housing material which is transmissive to the useful radiation to directly adjoin the luminescence diode chip without the risk of short-circuiting on account of electrically conductive particles. As an alternative, electrically conductive particles may also be used. If the concentration of the latter in the housing material is sufficiently low, the risk of short-circuiting can likewise be at least largely avoided. In this case, the maximum concentration depends on the aggregate size. With LSCB, which has a small aggregate size compared with customary carbon black particles, it is possible to use a higher concentration in association with the same risk of short-circuiting.

Generally, the radiation-absorbing particles advantageously have an average particle diameter of less than or equal to 100 nm (particle average). Such small particles can be dispersed particularly well in a housing material. In the case of carbon black, the primary particles of the agglomerates preferably have such a small average particle diameter.

The housing material which is transmissive to the useful radiation preferably has a casting composition or a moulding composition. With materials of this type, it is possible to produce housing parts of well-defined forms and dimensions. Casting compositions can be potted or moulded for example in an injection-moulding method. Moulding compositions can be processed in a transfer moulding method.

In one expedient embodiment, the housing material which is transmissive to the useful radiation has at least one of the materials from the group comprising epoxy resin, acrylate, silicone, thermoplastic and hybrid material with at least one of said materials.

In a further preferred embodiment, the luminescence diode chip is encapsulated or surrounded by the housing material which is transmissive to the useful radiation. In particular, it is possible for the housing material to directly adjoin the luminescence diode chip.

In one expedient embodiment, the component has a housing basic body with a housing cavity in which the luminescence diode chip is mounted. The housing cavity is at least partly filled with the housing material which is transmissive to the useful radiation. The housing cavity is preferably filled by potting with the composition which is transmissive to the useful radiation.

A further advantageous embodiment of the component provides for the component to have a housing body having an exterior area. The housing material which is transmissive to the useful radiation is applied at least to the exterior area of the housing body.

The housing material applied on the exterior area of the housing body may expediently be present in the form of a foil. The latter is fixed on the exterior area of the housing body for example by being laminated on or by means of an adhesive. The foil advantageously has a constant thickness. It is expediently embodied in flexible fashion. As an alternative, it is also possible for the thickness of the foil to vary. This can be realized for example by structuring a foil with constant thickness in a targeted manner.

In addition or as an alternative, it is also possible to use as housing material a foil which is admixed with radiation-absorbing particles.

A luminescence diode chip is specified whose exterior area is provided with a covering material which is admixed with radiation-absorbing particles in a targeted manner for setting a predetermined radiant intensity or luminous intensity of a useful radiation emitted by the luminescence diode chip. The covering material is preferably applied directly on the luminescence diode chip. The covering material is particularly preferably present in the form of a foil. The foil is fixed on the exterior area of the luminescence diode chip for example by being laminated on or by means of an adhesive. This may additionally be effected in the wafer assemblage, that is to say before a multiplicity of luminescence diode chips are singulated from a common assemblage.

DETAILED DESCRIPTION OF THE DRAWINGS

In the exemplary embodiments and figures, identical or identically acting constituent parts are in each case provided with the same reference symbols. The illustrated constituent parts and also the size relationships of the constituent parts among one another are not necessarily to be regarded as true to scale. But rather, some details of the figures are illustrated with an exaggerated size in order to afford a better understanding.

Figure 1:
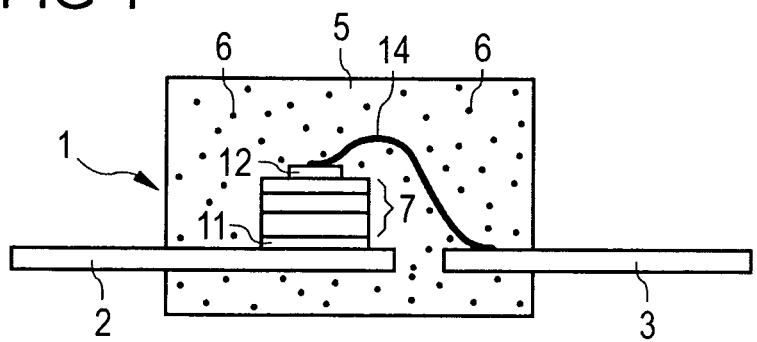
FIG. 1 shows a schematic sectional view of a first exemplary embodiment of the optoelectronic component.

In the case of the optoelectronic component illustrated in FIG. 1, a luminescence diode chip 1 is fixed by a rear-side contact 11 on a first electrical connection 2 of a leadframe by means of an electrically conductive connecting means, for example a metallic solder or an adhesive. On a side remote from the rear-side contact 11, the luminescence diode chip 1 has a front-side contact 12, which is electrically conductively connected to a second electrical connection 3 of the leadframe by means of a bonding wire 14.

Free surfaces of the luminescence diode chip 1, the bonding wire 14 and also partial regions of the electrical connections 2, 3 are directly enclosed by a housing material 5, which is transmissive to an electromagnetic radiation emitted by the luminescence diode chip 1 during the operation thereof. Said housing material 5 is for example a potting composition having more than 80% by weight of epoxy casting resin. Furthermore, the potting composition may also have additives such as, for example, diethylene glycol monomethyl ether, Tegropren 6875-45 and Aerosil 200.

As an alternative or in addition, the housing material 5 has e.g. at least one hybrid material. Hybrid materials make it possible to combine the positive properties of different materials with one another. It is thereby possible for example to attenuate or eliminate disadvantageous properties of a material. By way of example, a polymer hybrid material is used. Examples of appropriate hybrid materials are silicone-modified epoxy resins, which age to a lesser extent than conventional epoxy resins under the action of ultraviolet light, but for the rest have essentially the positive physical properties of conventional epoxy resins. It is also possible to mix at least one epoxy resin and at least one silicone with one another. Examples of suitable hybrid materials of this type are specified for example in US 2002/0192477 A1 or in US 2005/0129957 A1, the disclosure content of both of which is hereby incorporated by reference.

It is furthermore possible to combine silicone with acrylate or silicone with acrylate and epoxy resin. It goes without saying that it is also possible not to use a hybrid material and to use for example an acrylate, a silicone or a thermoplastic as constituent of the housing material 5.

Radiation-absorbing particles 6 are mixed into the potting composition 5. By way of example, an industrially produced carbon black having defined technical properties is involved in this case. The carbon black particles are composed of a plurality of primary particles which together form an aggregate structure. This aggregate structure is preferably as compact as possible. The primary particles have an average diameter of less than or equal to 100 nm. By way of example, the average diameter is 50 to 60 nm. The average diameter is to be understood as the particle average of the measured diameters. The aggregates have an average diameter of less than or equal to 1 μm. A suitable industrial carbon black is for example the commercially available "Printex 25", which is produced by the company Degussa. This is a so-called "low structure carbon black" (LSCB) with a compact aggregate structure.

The particle size of the primary particles and of the aggregates can be determined by various methods. The two sizes can be determined for example by means of a transmission electron microscope (TEM), which is preferred. The aggregate size may for example also be determined by means of scattered light intensity measurements. By way of example, differential mobility analyzers (DMA), which are usually used for determining the electrical mobility diameter of nanoscale aerosols, are also suitable for determining the primary particle size. Measurement methods of this type and also further possible measurement methods for determining the relevant particle diameters are known to the person skilled in the art.

In contrast to elongated aggregate structures, for example, compact aggregate structures have the advantage that they influence an electrical conductivity of the material into which they are mixed to a lesser extent. There are investigations which show that LSCB particles cause a transition from a non-conducting state to a conducting state of the matrix material only at a volume concentration four times as high as for so-called "high structure carbon black" (HSCB). In the case of LSCB particles, said transition starts for example from a volume concentration of approximately 40% by volume, whereas this may already be the case at a concentration of 10% by volume for HSCB particles. The presence of salts may shift said transition to lower concentrations.

Agglomerates which may have a size of the order of magnitude of several micrometers or several tens of μm often form from carbon black aggregates. Such agglomerates should be avoided as far as possible. When the carbon black particles are mixed into the uncured potting composition, they are incorporated homogeneously with the aid of rotary mixers operated at very high speeds. High shear forces occur during this incorporation process and have the effect of breaking up possible agglomerates at least to a great extent.

The radiation-absorbing particles 6 are mixed into the potting composition for example with a concentration of at most 0.01% by weight, which corresponds to approximately 0.03% by volume.

Figure 2:
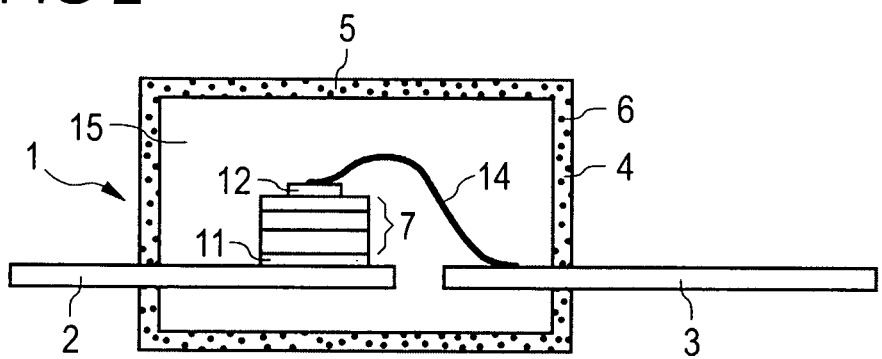
FIG. 2 shows a schematic sectional view of a second exemplary embodiment of the optoelectronic component.

The exemplary embodiment of the component as illustrated in FIG. 2 differs from the exemplary embodiment explained above with reference to FIG. 1 by virtue of the fact that the luminescence diode chip 1, the bonding wire 14 and also partial regions of the electrical connections 2 and 3 are enclosed by a transparent inner housing material 15, which is free of radiation-absorbing particles 6. Said inner housing material 15 comprises for example an epoxy, silicone or acrylate resin that is conventionally used in light-emitting diode technology or some other suitable radiation-transmissive material such as, for example, inorganic glass.

A housing material 5 admixed with radiation-absorbing particles 6 is applied to said inner housing material 15. Said housing material 5 is present in the form of a layer 4 covering for example the entire surface of the inner housing material 15. It is likewise conceivable for the layer 4 to cover only a partial region of said surface. The housing material 5 and the radiation-absorbing particles may be constituted as explained above in connection with the exemplary embodiment illustrated in FIG. 1.

As an alternative to the exemplary embodiment illustrated in FIG. 2, it is also possible for a part of the housing that directly encapsulates the luminescence diode chip 1 to be admixed with radiation-absorbing particles 6, on which part a transparent housing material free of radiation-absorbing particles may in turn be applied. Such an alternative configuration is also possible for example in the case of the exemplary embodiment described below with reference to FIG. 12.

Figure 3:
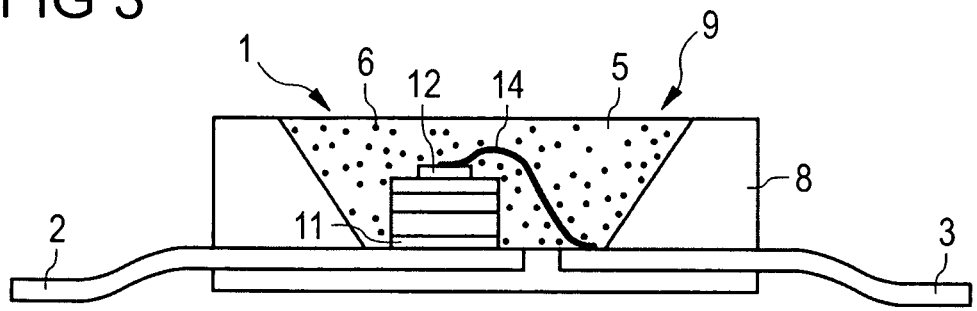
FIG. 3 shows a schematic sectional view of a third exemplary embodiment of the optoelectronic component.

The exemplary embodiment of the optoelectronic component as illustrated in FIG. 3 has a housing basic body 8 with a recess 9. The luminescence diode chip 1 is applied in said recess on a first electrical connection 2 of a leadframe. As in the exemplary embodiments explained above with reference to FIGS. 1 and 2, a rear-side contact 11 of the luminescence diode chip is electrically conductively connected to the first electrical connection 2 and a front-side contact 12 is electrically conductively connected to the second electrical connection 3 of the leadframe.

The housing basic body 8 is formed by means of injection moulding, for example which may be effected prior to the mounting of the luminescence diode chip 1. It comprises a light-opaque plastic, for example. The recess 9, with regard to its form, is embodied as a reflector for the electromagnetic radiation emitted by the luminescence diode chip 1 during the operation thereof.

The recess 9 is filled with a housing material 5 which is transmissive to a useful radiation emitted by the component. It has, in particular, radiation-absorbing particles 6 mixed in homogeneously. The housing material 5 and the radiation-absorbing particles 6 may be constituted as in the exemplary embodiments described above with reference to FIGS. 1 and 2.

The useful radiation emitted by the component is for example exclusively a radiation emitted by the luminescence diode chip 1. As an alternative, it is possible for this electromagnetic radiation to be converted into a radiation in a different wavelength range by means of at least one phosphor. It is also possible, in particular, to mix phosphor particles together with the radiation-absorbing particles 6 into the material 5 which is transmissive to the useful radiation of the component. If the concentration of the phosphor in the beam path of the electromagnetic radiation emitted by the luminescence diode chip 1 is high enough, then said radiation may also be completely converted.

The luminescence diode chip 1 emits electromagnetic radiation from the UV range, by way of example. Said radiation is converted into visible light by means of one or a plurality of phosphors, by way of example. As an alternative, the luminescence diode chip 1 emits blue light, by way of example. Said blue light may be partly converted into yellow light by means of a phosphor, by way of example, so that white light can be generated by mixing the blue and yellow light in a balanced mixing ratio.

Suitable phosphors include, in principle, all the phosphors known for application in LEDs. Examples of such phosphors and phosphor mixtures that are suitable as converters are:
  chlorosilicates, as disclosed for example in DE 10036940 and the prior art described therein,
  orthosilicates, sulfides, thiometals and vanadates as disclosed for example in WO 2000/33390 and the prior art described therein,
  aluminates, oxides, halophosphates, as disclosed for example in U.S. Pat. No. 6,616,862 and the prior art described therein,
  nitrides, siones and sialones as disclosed for example in DE 10147040 and the prior art described therein, and
  garnets of the rare earths such as YAG:Ce and the alkaline earth metal elements as disclosed for example in US 2004-062699 and the prior art described therein.

The luminescence diode chip has a semiconductor layer sequence 7 based on nitride compound semiconductor materials. Nitride compound semiconductor materials are compound semiconductor materials containing nitrogen, such as the materials from the system $In_xAl_yGa_{1-x-y}N$ where $0 \leq x \leq 1$, $0 \leq y \leq 1$ and $x+y \leq 1$. In the present case, the group of radiation-emitting luminescence diode chips based on nitride compound semiconductor material includes, in particular, those luminescence diode chips in which the semiconductor layer sequence 7 contains at least one individual layer having a material from the nitride compound semiconductor material system.

The semiconductor layer may have for example a conventional pn junction, a double heterostructure, a single quantum well structure (SQW structure) or a multiple quantum well structure (MQW structure). Such structures are known to the person skilled in the art and are therefore not explained in any greater detail at this juncture. Examples of such MQW structures are described in the documents WO01/39282, U.S. Pat. No. 6,172,382 U.S. Pat. No. 5,831,277 and U.S. Pat. No. 5,684,309, the disclosure content of all of which is hereby incorporated by reference.

The measurement results illustrated graphically in FIGS. 4 to 10 were obtained with components constituted in the manner of the component explained above with reference to FIG. 3. The industrial carbon black Printex 25 from the company Degussa was used as radiation-absorbing particles. The measurements were effected using four identical housing forms, into which, however, different luminescence diode chips 1 having different emission spectra had been mounted.

Figure 4:
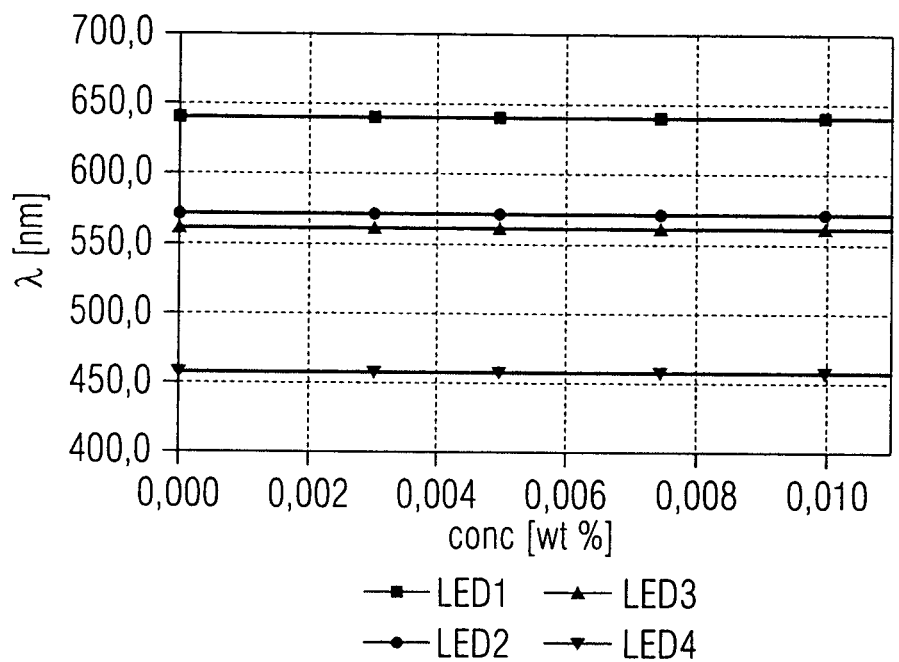
FIG. 4 shows a graphical plotting of wavelengths of the emission maxima of components with different luminescence diode chips as a function of the concentration of radiation-absorbing particles.

In FIG. 4, the wavelengths of the emission maxima for the four component types LED1, LED2, LED3, LED4 are specified as a function of the concentration (conc) of the radiation-absorbing particles. The wavelength is specified in nm and the concentration is specified in percent by weight (wt %). The emission frequency is the only significant difference among these LED's in connection with FIG. 4.

FIG. 4 reveals that the emission maximum of the component does not change appreciably in the concentration range between 0 wt % and 0.01 wt % of the radiation-absorbing particles. The luminescence diode chip of the first component LED1 has an emission maximum at approximately 640 nm, which corresponds to red light. The emission maximum of the luminescence diode chip used in the second component LED2 is at approximately 570 nm, which corresponds to a yellowish-green colour. The third optoelectronic component LED3 emits green light having an emission maximum at approximately 560 nm. The luminescence diode chip of the fourth component LED4 emits blue light having an emission maximum at approximately 460 nm.

Figure 5:
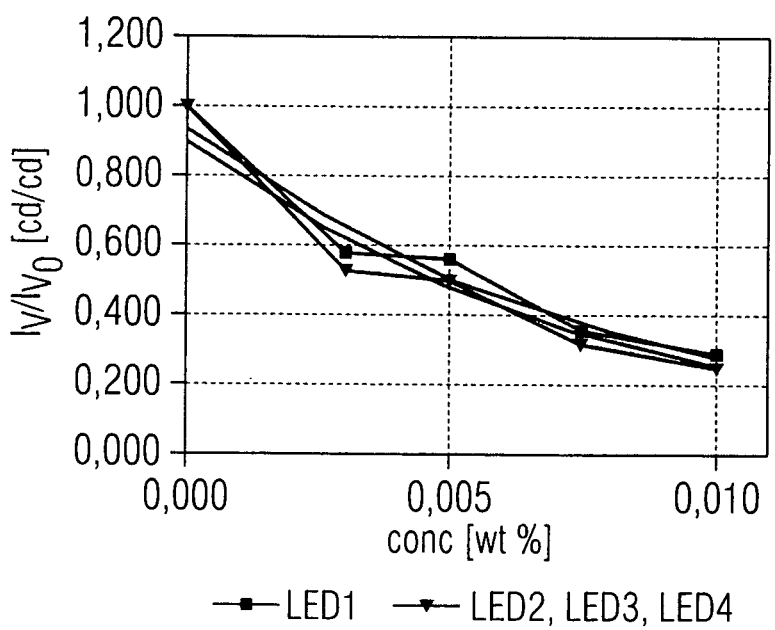
FIG. 5 shows a graphical plotting of the normalized luminous intensity of components with different luminescence diode chips as a function of the concentration of radiation-absorbing particles.
Figure 6:
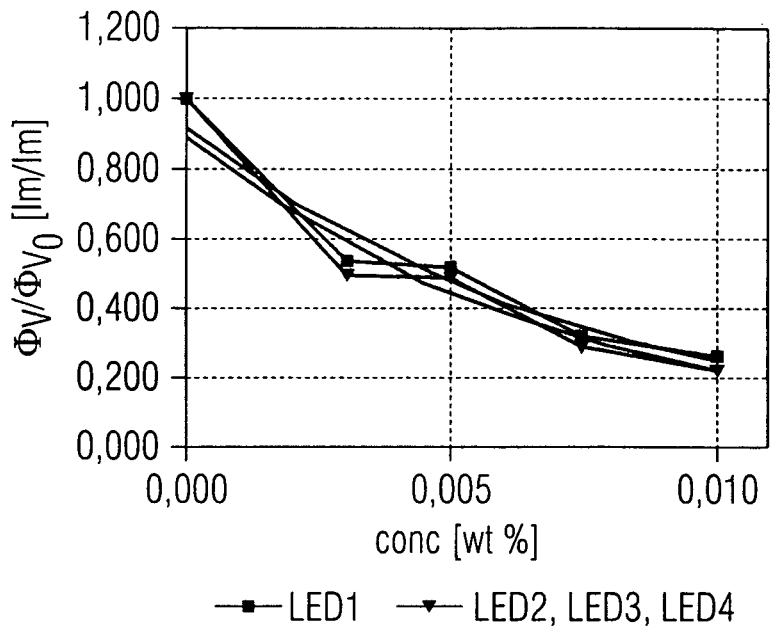
FIG. 6 shows a graphical illustration of the normalized luminous flux of components with various luminescence diode chips as a function of the concentration of radiation-absorbing particles.

FIG. 5 illustrates the luminous intensity $I_V$ emitted by the four component types as a function of the concentration of the radiation-absorbing particles. The luminous intensity $I_V$ is in each case normalized to the luminous intensity $I_{V0}$ emitted by the component having no radiation-absorbing particles (conc=0 wt %). FIG. 6 illustrates, in a corresponding plotting, the normalized luminous flux $\phi_V$ as a function of the concentration of the radiation-absorbing particles.

The graphs illustrated in FIGS. 5 and 6 reveal that both the luminous intensity $I_V$ and the luminous flux $\phi_V$ of the component types LED2, LED3 and LED4 decrease approximately in the same way as the concentration of the absorbing particles increases. The measurement points for these components are symbolized by a triangle with its vertex facing downwards. By comparison therewith, the measurement results for the first component type LED1 show slight deviations. Although the coarse profile of the decrease in luminous intensity $I_V$ and luminous flux $\phi_V$ as the concentration of the absorber particles increases corresponds to that of the second to fourth components LED2, LED3, LED4, the luminous intensity $I_V$ and luminous flux $\phi_V$ decrease to a somewhat lesser extent overall for the first component type LED1, which has a red-emitting luminescence diode.

In addition to the two graphs in each of FIGS. 5 and 6 that show the measurement points interconnected by straight lines, FIGS. 5 and 6 also illustrate two exponential curves which have been respectively matched to the measurement points for the component type LED1 and for the component types LED2 to LED4. While the straight lines directly connect measurement points of the same type with each other, the exponential curves are approximations that were calculated in order to show that the trend of the measurement points is roughly exponential.

Figure 7:
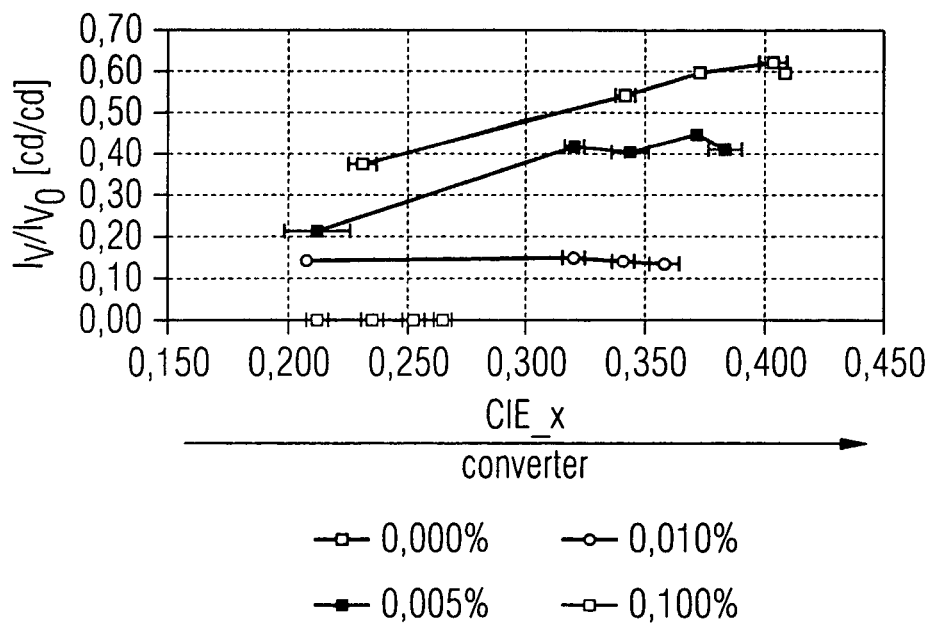
FIG. 7 shows a graphical illustration of the normalized luminance of a component as a function of the resulting x value of the CIE chromaticity diagram and for various concentrations of a phosphor in the housing material admixed with radiation-absorbing particles.
Figure 8:
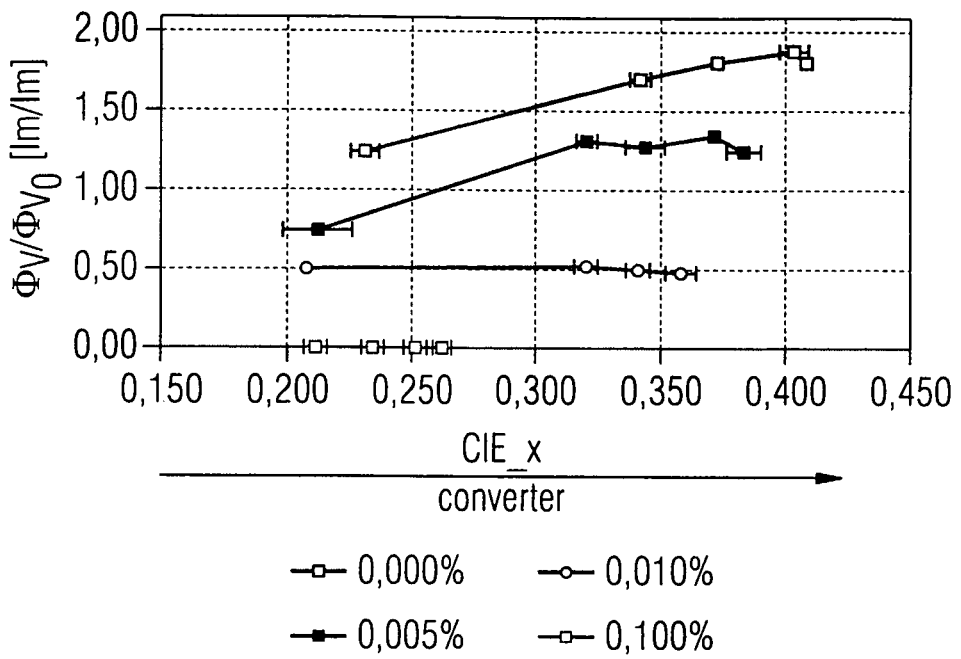
FIG. 8 shows a graphical illustration of the normalized luminous flux of a component as a function of the resulting x value of the CIE chromaticity diagram and for various concentrations of a phosphor in the housing material admixed with radiation-absorbing particles.

FIGS. 7 and 8 illustrate measurements of the luminous intensity $I_V$ and of the luminous flux $\phi_V$ for the fourth component type LED4 (blue-emitting luminescence diode chip) as a function of the color locus emitted by the component, the colour locus being represented by the x value of the CIE chromaticity diagram. The figures in each case depict four series of measurements that were carried out with four different concentrations of the radiation-absorbing particles. A yellow phosphor that can be excited by blue light was additionally mixed into the potting composition of the component. YAG:Ce, an yttrium aluminium garnet activated with Ce, is involved in this case.

Within one series of measurements, the concentration of the absorber particles is constant, while the concentration of phosphor varies. In the series of measurements in which the concentration of absorber particles is 0 wt %, the CIE_x value changes from approximately 0.23 to approximately 0.41 as the phosphor content increases. The increasing phosphor concentration is in each case indicated by an arrow provided with the expression "converter" beneath the diagrams in FIG. 7 and FIG. 8. In comparison with the other series of measurements in which there were absorber particles having concentrations of 0.005 wt %, 0.01 wt % or 0.1 wt %, it can be discerned that both the lower limit and the upper limit of the CIE_x value, which were measured at approximately identical phosphor concentrations, are in each case shifted towards smaller values.

At CIE_x values of between 0.2 and 0.25, the mixed light made up of yellow and blue light has as a result a hue that appears blue, while the yellow colour component predominates for CIE_x values of between approximately 0.4 and 0.45. In the range between 0.3 and 0.35, the mixing of blue and yellow light produces white light overall. The results show that when absorber particles are added to the component into whose potting composition phosphor particles are mixed, the concentration of the phosphor particles has to be increased in order to avoid a shift in the resulting color impression emitted by the component.

In the production of a component with converter material, it is thus possible, for the purpose of setting a well-defined luminous intensity, firstly to select the concentration of the radiation-absorbing particles in a targeted manner depending on the measured radiant intensity or luminous intensity of the luminescence diode chip. For the targeted setting of a desired color locus, the concentration of the phosphor may then be selected in a targeted manner depending on the concentration of the radiation-absorbing particles.

Figure 9:
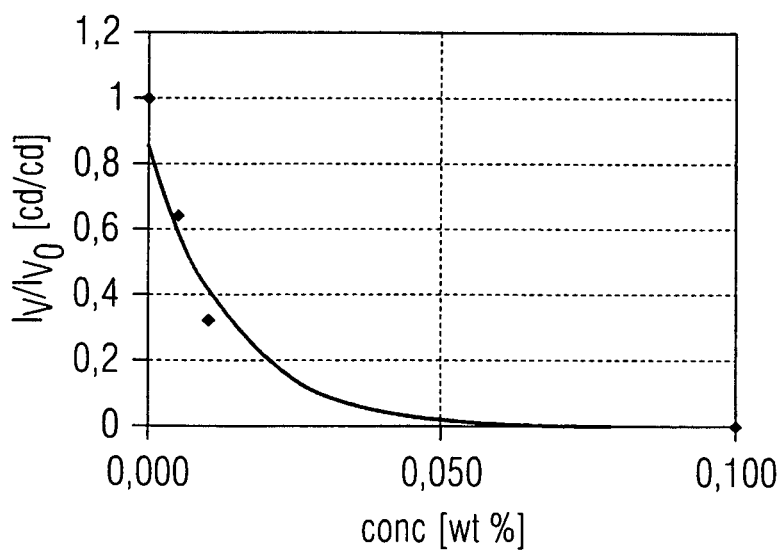
FIG. 9 shows a graphical illustration of the normalized luminous intensity of a component with a phosphor in the housing material admixed with the radiation-absorbing particles as a function of the concentration of the radiation-absorbing particles.
Figure 10:
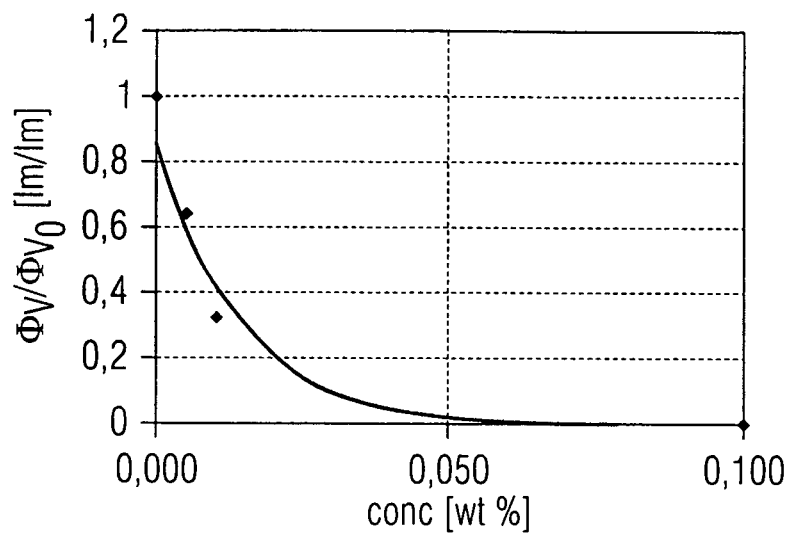
FIG. 10 shows a graphical illustration of the normalized luminous flux of a component with a phosphor in the housing material admixed with the radiation-absorbing particles as a function of the concentration of the radiation-absorbing particles.

FIGS. 9 and 10 graphically illustrate the luminous intensity $I_V$ and luminous flux $\phi_V$ as a function of the concentration of the absorber particles. The fourth component type LED4 is once again involved, in the case of which a concentration of phosphor particles that remains constant has respectively been mixed into the potting composition. The measurement results show that the radiant intensity or luminous intensity of components can be set continuously even when using phosphors.

Figure 11:
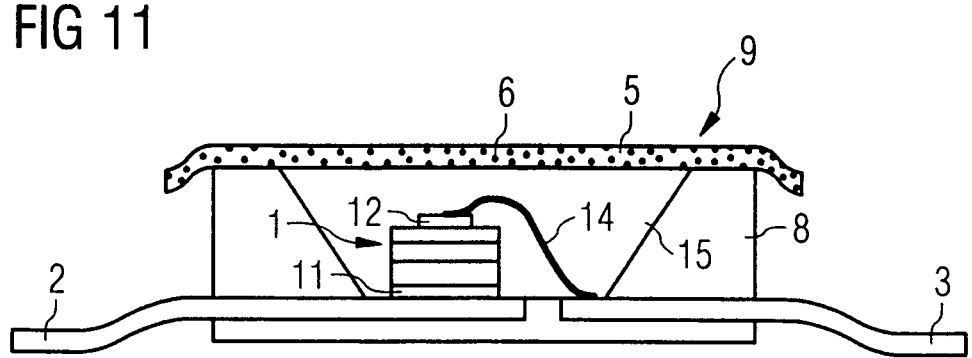
FIG. 11 shows a schematic sectional view of a fourth exemplary embodiment of the optoelectronic component.
Figure 12:
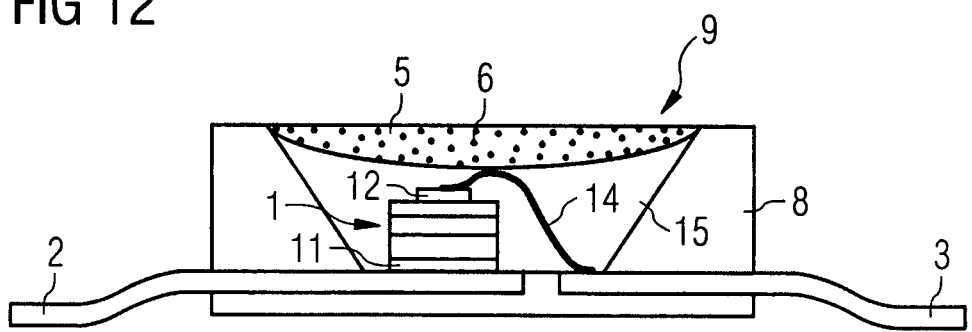
FIG. 12 shows a schematic sectional view of a fifth exemplary embodiment of the optoelectronic component.

The components illustrated in FIGS. 11 and 12 are similar to the component described above with reference to FIG. 3. One difference is that the recess 9 of the housing basic body 8 is in each case filled with a housing material 15 which is free of radiation-absorbing particles. The recess 9 is filled with the housing material 15 for example in such a way that the luminescence diode chip 1 mounted in the recess 9 is encapsulated by the housing material 15.

In the case of the components illustrated in FIGS. 11 and 12, the housing basic body 8 and the housing material 15 form a housing body. A further housing material 5 is applied to an exterior area of said housing body, said further housing material being transmissive to an electromagnetic radiation emitted by the luminescence diode chip 1 during the operation thereof and having radiation-absorbing particles 6. The housing material 5 and the radiation-absorbing particles 6 may, in principle, be constituted as described above in connection with the rest of the exemplary embodiments.

In the case of the component illustrated in FIG. 11, the housing material 5 containing the radiation-absorbing particles 5 is applied in layered fashion on the exterior area of the housing body 8, 15. During the production of the component, the housing material 5 may be provided in the form of a prefabricated layer having a constant thickness, for example, before it is applied to the exterior area of the housing body 8, 15. Application is effected by means of adhesive bonding or lamination, for example. It is possible, in particular, to provide the layered housing material 5 as a foil which is flexible and which can thus also be applied to uneven exterior areas of the housing body. After application, the foil may for example be cured and lose its flexibility.

A housing body 8, 15 having an uneven exterior area is illustrated by way of example in FIG. 12. By way of example, a housing material 5 with radiation-absorbing particles 6 that is provided as a foil can be applied to said exterior area. This possibility is not illustrated in FIG. 12, however. In the exemplary embodiment illustrated, the recess 9 is only partly filled with the housing material 15. The exterior area of said housing material 15 has a concave curvature and thus forms a well-like or trough-like depression. A housing material 5 having radiation-absorbing particles 6 is filled into said depression. The depression is filled for example by providing the housing material 5 in the form of an uncured composition, potting the depression formed by the exterior area of the housing material 15 with said composition and by subsequently curing the housing material 5.

In the case of the component illustrated in FIG. 12, the housing material 5 has a layered form which, however, does not have a constant thickness. The housing material 5 has for example a largest thickness in the region of the optical axis of the component, which thickness becomes increasingly smaller as the distance from the optical axis of the component increases. By means of such housing material layers 5 having a varying thickness, not only a light intensity or radiation intensity emitted by the component but also an emission characteristic of the component can be set in a targeted manner. It goes without saying that the variation of the thickness of the housing material 5 may be arbitrary, in principle, and is co-ordinated with the component present in an individual case and the emission characteristic to be obtained.

As an alternative to the example illustrated in FIG. 12, it is also possible for the housing material layer 5 to have a greater thickness in outer regions than in the center.

Furthermore, in the exemplary embodiments described with reference to FIGS. 11 and 12, it is also possible for the optoelectronic component to be free of a housing basic body 8. This may be realized for example by means of a configuration of the housing in the manner as in the case of the components described above with reference to FIGS. 1 and 2.

In all the exemplary embodiments, e.g. in addition or as an alternative to the use of a housing material admixed with radiation-absorbing particles 6, it is also possible for the luminescence diode chip to be provided with a foil which is admixed with radiation-absorbing particles. The foil has for example a silicone or a hybrid material with an epoxy resin. The radiation-absorbing particles may be constituted as already described above.

The invention is not restricted to the exemplary embodiments by the description of the invention on the basis of said exemplary embodiments. Rather, the invention encompasses any new feature and also any combination of features, which in particular comprises any combination of features in the patent claims, even if this feature or this combination is itself not explicitly specified in the patent claims or exemplary embodiments. In addition to carbon black there are a multiplicity of further materials which are suitable, in principle, for the use as radiation-absorbing particles in the component. The suitability of the materials may depend on the emission spectrum of the useful radiation emitted by the component.

The invention claimed is:

1. An optoelectronic component which emits radiation, comprising:
    a housing; and
    a luminescence diode chip arranged in the housing;
    wherein the housing has a housing material which is transmissive to the emitted radiation and which is admixed with radiation-absorbing particles including an industrial carbon black having a compact low structure carbon black (LSCB) for setting a predetermined radiant intensity or luminous intensity of the emitted radiation; and
    wherein the LSCB comprises aggregates composed of a plurality of primary particles, the aggregates having an average extent of less than or equal to 1 μm, and the primary particles having an average diameter of less than or equal to 100 nm.

2. The optoelectronic component according to claim 1, wherein the radiation-absorbing particles are absorbent for an entire wavelength spectrum of the emitted radiation.

3. The optoelectronic component according to claim 1, wherein the radiation-absorbing particles are absorbent for an entire wavelength spectrum of the radiation emitted by the luminescence diode chip during operation thereof.

4. The optoelectronic component according to claim 1, wherein the housing material which is transmissive to the emitted radiation has a casting composition or moulding composition.

5. The optoelectronic component according to claim 1, wherein the housing material which is transmissive to the emitted radiation has at least one material from a group comprising epoxy resin, acrylate, silicone, thermoplastic and hybrid material with at least one of said materials.

6. The optoelectronic component according to claim 1, wherein the luminescence diode chip is encapsulated or surrounded by the housing material which is transmissive to the emitted radiation.

7. The optoelectronic component according to claim 1, wherein the housing material which is transmissive to the emitted radiation has at least one phosphor.

8. The optoelectronic component according to claim 1, wherein an absorption coefficient of the radiation-absorbing particles varies by less than 10% in an entire spectrum of the emitted radiation.

9. The optoelectronic component according to claim 1, wherein, the component has a housing basic body with a housing cavity in which the luminescence diode chip is mounted and which is at least partly filled with the housing material which is transmissive to the useful radiation.

10. The optoelectronic component according to claim 1, wherein, the component has a housing body and the housing material which is transmissive to the useful radiation is applied on an exterior area of the housing body.

11. The optoelectronic component according to claim 10, wherein the housing material which is transmissive to the useful radiation is applied in the form of a foil on the exterior area of the housing body.

12. A method for producing an optoelectronic component which emits a useful radiation, comprising the steps of:
    providing a luminescence diode chip;
    measuring the radiant intensity or luminous intensity emitted by the luminescence diode chip;
    providing a composition which is transmissive to the useful radiation and which is admixed with radiation-absorbing particles including an industrial carbon black having a compact low structure carbon black (LCBS);
    selecting in a targeted manner a concentration of the radiation-absorbing particles in the composition depending on the measured radiant intensity or luminous intensity of the luminescence diode chip, for setting a predetermined radiant intensity or luminous intensity of the emitted radiation to be obtained in the component; and
    arranging the composition which is transmissive to the useful radiation in a beam path of the electromagnetic radiation emitted by the luminescence diode chip during the operation thereof;
    wherein the LSCB comprises aggregates composed of a plurality of primary particles, the aggregates having an average extent of less than or equal to 1 μm, and the primary particles having an average diameter of less than or equal to 100 nm.

13. The method according to claim 12, wherein the luminescence diode chip is encapsulated or surrounded by the composition which is transmissive to the useful radiation.

14. The method according to claim 12, wherein a composition which is transmissive to the useful radiation and which also has at least one phosphor besides the radiation-absorbing particles is provided; and
    wherein a concentration of the at least one phosphor in the composition is selected in a targeted manner depending on a selected concentration of the radiation-absorbing particles, for setting a color locus to be obtained of the useful radiation to be emitted by the component.

15. The method according to claim 12, further comprising the steps of:
    providing a housing basic body having a housing cavity;
    mounting the luminescence diode chip in the housing cavity; and
    at least partly potting the housing cavity with the composition which is transmissive to the useful radiation.

16. The method according to claim 12, wherein a component is provided which contains the luminescence diode chip and which has a housing body having an exterior area, the composition which is transmissive to the useful radiation being applied to the exterior area of the housing body.

17. The method according to claim 16, wherein the composition which is transmissive to the useful radiation is provided prior to application on the exterior area comprises a prefabricated material layer.

18. The method according to claim 16, wherein the composition which is transmissive to the useful radiation is provided prior to application on the exterior area comprises a foil.

* * * * *